（12）United States Patent
Hazucha et al.

(10) Patent No.: US 7,053,663 B2
(45) Date of Patent: May 30, 2006

(54) DYNAMIC GATE WITH CONDITIONAL KEEPER FOR SOFT ERROR RATE REDUCTION

(75) Inventors: Peter Hazucha, Beaverton, OR (US); Atila Alvandpour, Portland, OR (US); Ram Krishnamurthy, Portland, OR (US); Tanay Karnik, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 256 days.

(21) Appl. No.: 10/107,779

(22) Filed: Mar. 26, 2002

(65) Prior Publication Data

US 2003/0185087 A1 Oct. 2, 2003

(51) Int. Cl.
*H03K 19/096* (2006.01)

(52) U.S. Cl. .......................... 326/121; 326/93; 326/119

(58) Field of Classification Search ............. 326/73–98, 326/112, 119, 121
See application file for complete search history.

(56) References Cited

U.S. PATENT DOCUMENTS

| 5,896,046 | A | * | 4/1999 | Bjorksten et al. ............. 326/98 |
| 6,172,531 | B1 | * | 1/2001 | Aipperspach et al. ....... 326/108 |
| 6,184,718 | B1 | * | 2/2001 | Tran et al. ................... 326/121 |
| 6,529,045 | B1 | * | 3/2003 | Ye et al. ........................ 326/95 |

* cited by examiner

*Primary Examiner*—Don Le
(74) *Attorney, Agent, or Firm*—Jeffrey B. Huter

(57) ABSTRACT

A dynamic logic gate with a conditional keeper, the conditional keeper comprising a pMOSFET pull-up that switches ON only after the dynamic logic gate completes an evaluation so as to avoid contention with the pull-down network. By sizing the conditional keeper to be stronger than the half-keeper, embodiments may realize a significant reduction in soft error rates that are latched.

13 Claims, 6 Drawing Sheets

DYNAMIC GATE WITH CONDITIONAL KEEPER FOR SOFT ERROR RATE REDUCTION

FIELD

Embodiments of the present invention relate to digital circuits, and more particularly, to dynamic (or domino) logic gates.

BACKGROUND

As semiconductor process technology advances to provide circuit devices and interconnects having smaller dimensions, circuit supply voltage and parasitic capacitance of circuit nodes may be reduced, leading to a decrease in signal charge. Signal charge may represent information. As a result, reliability issues may arise because alpha particles and cosmic rays may change stored charge to a sufficient degree so as to corrupt the information stored on circuit nodes. Such events are commonly called soft errors. Furthermore, an increase in the number of circuit nodes per die may also increase the rate of soft errors.

Consider a computer system, such as that illustrated in FIG. 1. In FIG. 1, microprocessor 102 comprises many sub-blocks, such as arithmetic logic unit (ALU) 104 and on-chip cache 106. Microprocessor 102 may also communicate to other levels of cache, such as off-chip cache 108. Higher memory hierarchy levels, such as system memory 110, are accessed via host bus 112 and chipset 114. In addition, other off-chip functional units, such as graphics accelerator 116 and network interface controller (NIC) 118, to name just a few, may communicate with microprocessor 102 via appropriate busses or ports.

Among the most sensitive circuits in a computer system are memory circuits and latches. In particular, high-performance dynamic gates are often used in the critical paths of a microprocessor. The input noise margin of a dynamic gate is often smaller than that of a static CMOS (Complementary Metal Oxide Semiconductor) gate, and dynamic gates make use of pre-charged internal nodes, which may be susceptible to soft errors. With clock frequencies and the number of pipeline levels increasing, the number of logic stages between latch boundaries is decreasing. As a result, noise transients due to soft errors may propagate to a latch boundary and be captured, which may lead to an incorrect result in a microprocessor or computer system.

DESCRIPTION OF EMBODIMENTS

Figure 1:
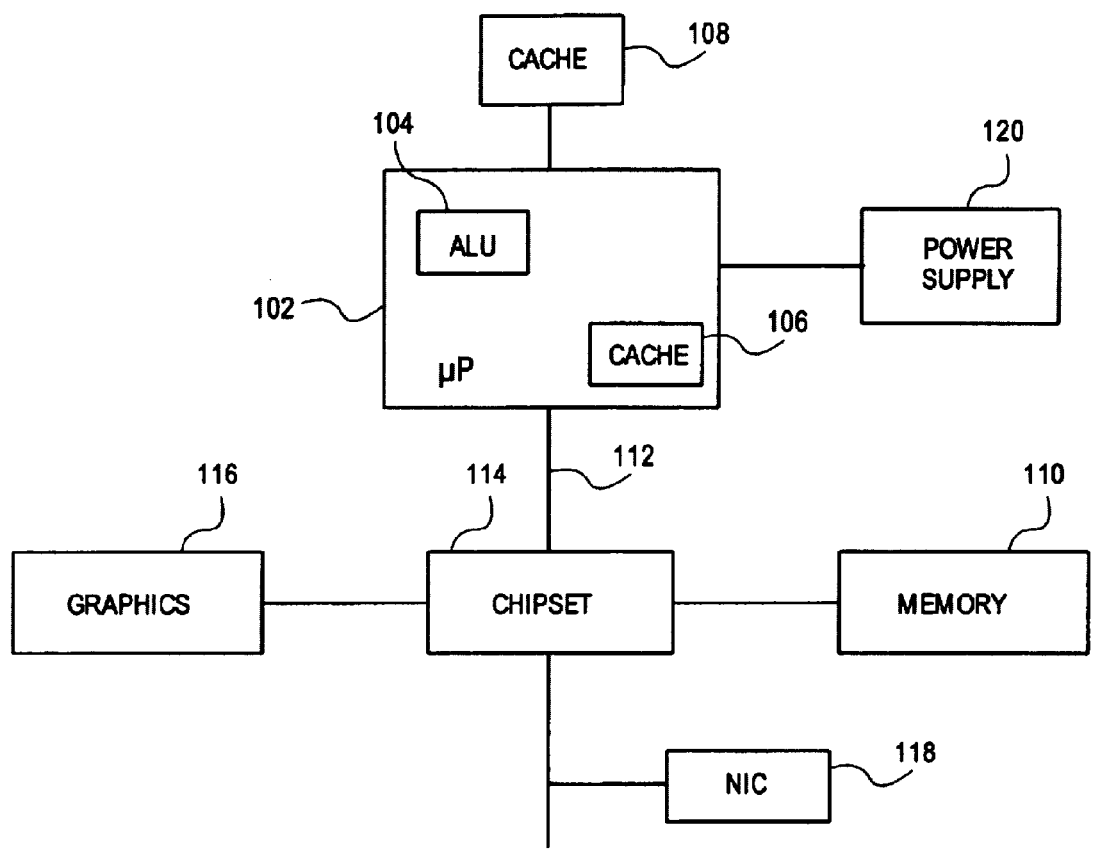
FIG. 1 is a high-level architecture for a computer system.
Figure 2:
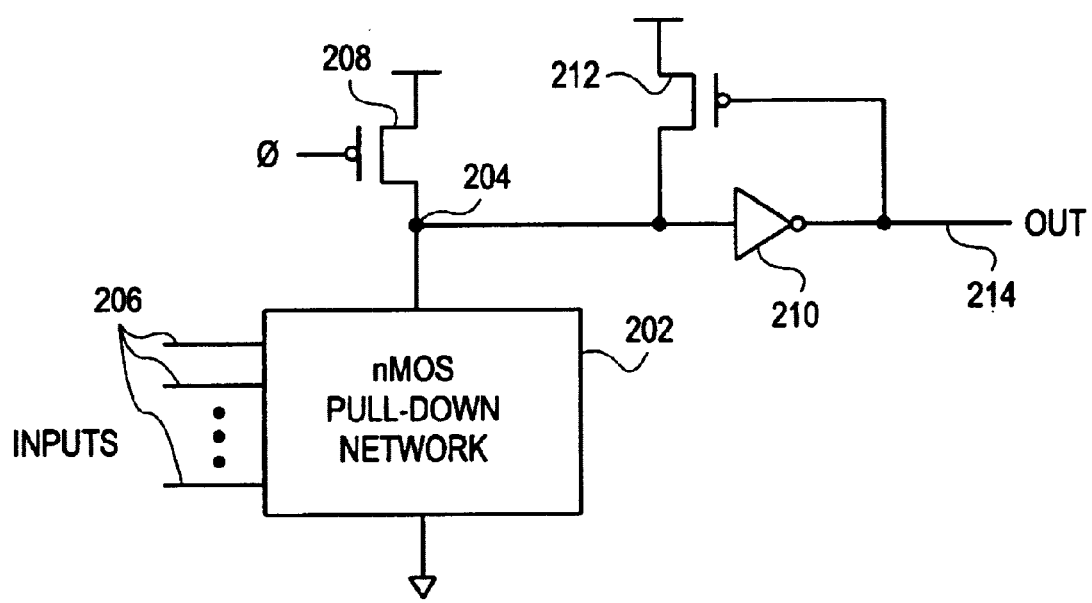
FIG. 2 is a prior art dynamic logic gate.

Before describing in detail embodiments of the present invention, it is instructive to first consider a prior art dynamic (or domino) gate, shown in FIG. 2. The clock signal is represented by $\phi$. During a pre-charge phase, the clock signal and input ports 206 are LOW (e.g., $V_{SS}$) so that pull-up pMOSFET (p-Metal Oxide Semiconductor Field Effect Transistor) 208 charges node 204 HIGH (e.g., $V_{CC}$). (For a boundary stage, an additional clocked pull-down nMOSFET may be inserted between ground and nMOS pull-down network 202 to isolate nMOS pull-down network 202 from ground during a pre-charge phase.) During an evaluation phase, the clock signal is HIGH and nMOS pull-down network 202 provides a conditional low impedance path between node 204 and ground (substrate), depending upon the logical states of input ports 206. If a conditional low impedance path is provided by nMOS pull-down network 202, node 204 is discharged to $V_{SS}$.

A half-keeper, comprising inverter 210 and pull-up pMOSFET 212, is sized to ideally maintain node 204 HIGH unless it is otherwise pulled LOW by nMOS pull-down network 202 during an evaluation phase. Upon completing an evaluation, the output signal at output port 214 propagates through other logic circuits (not shown) and is eventually captured by a latch or other dynamic stage.

The dynamic gate of FIG. 2 is mostly sensitive to soft errors when node 204 evaluates to $V_{CC}$, that is, when pull-down nMOS network 202 remains OFF during an evaluation phase. This may be reasoned as follows. Assume that node 204 evaluates to $V_{CC}$. Because the half-keeper provides a relatively weak pull-up function, a relatively small negative charge disturbance may discharge node 204 below the trip point of inverter 210, resulting in the half-keeper turning OFF. Under such a scenario, sub-threshold leakage current through nMOS pull-down network 202 may cause node 204 to discharge to a low enough voltage such that inverter 210 provides an incorrect signal at output port 214.

In particular, consider a wide OR dynamic gate. For such a gate, there are several nMOSFET drains in nMOS pull-down network 202 that are connected to node 204, and consequently the total n-drain diffusion area connected to node 204 may be much larger than the total p-diffusion area. Because n-diffusion areas collect only negative charge, there is a higher probability of soft errors discharging a node that evaluates HIGH than there is of soft errors charging a node that evaluates LOW.

Figure 3:
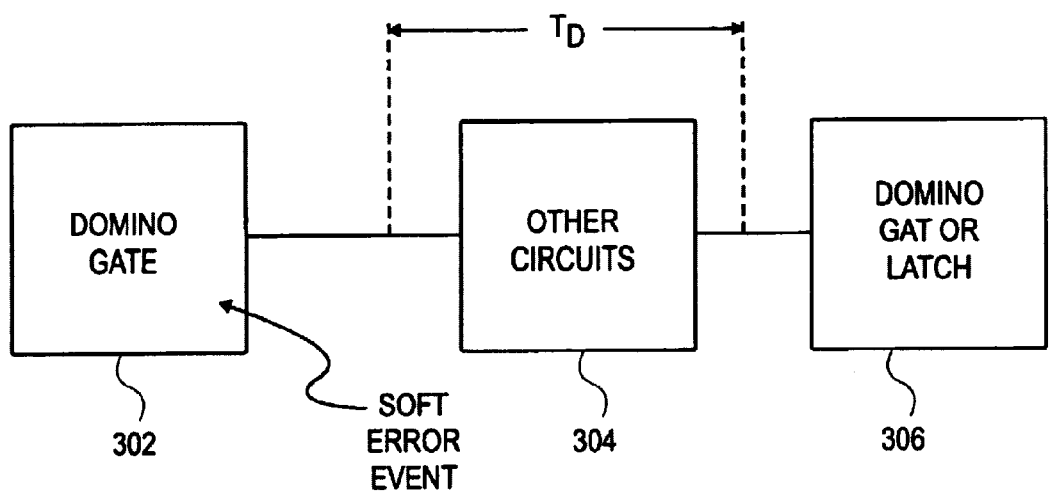
FIG. 3 is a prior art pipelined circuit employing a dynamic logic gate.

Not all soft errors at node 204 propagate to subsequent stages. Some errors may occur too late in an evaluation phase and may not have enough time to propagate to a latch boundary before the latch closes. This may be explained in the context of the pipeline stage shown in FIG. 3. Dynamic gate 302 depicts the dynamic gate of FIG. 2 in which a soft error event has occurred. The incorrect signal propagates through "other circuits" 304 before being latched by latch 306, where $T_D$ denotes the time delay from node 204 to the input port of latch 306. If an incorrect signal arrives at latch 306 within its hold-time, then an incorrect value may be latched. Consequently, a soft error will be latched only if it occurs in an evaluation phase and such that, when shifted by $T_D$, it arrives at the latch within its hold-time. This phenomenon is often called timing derating, and it accounts for the fraction of soft errors that could cause an observable error, e.g., a wrong computational result.

Figure 4:
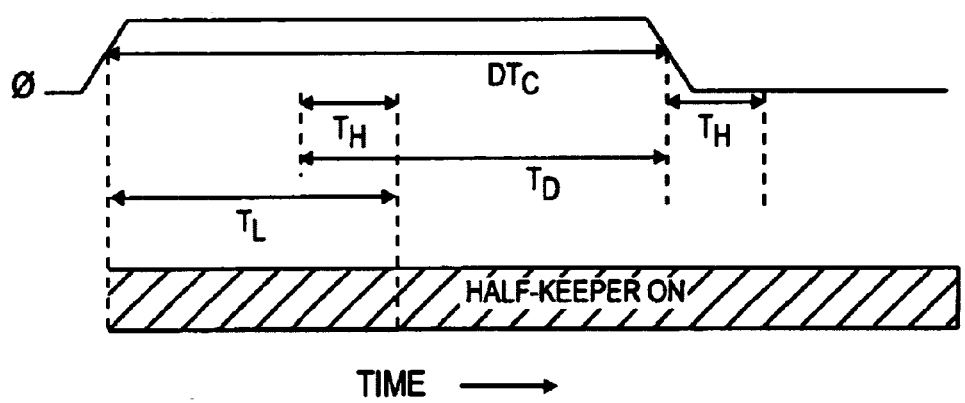
FIG. 4 is a timing diagram for the dynamic logic gate and pipelined circuit of FIGS. 2 and 3.

Let $T_H$ denote the hold-time, $T_C$ denote the clock period, and D denote the duty cycle. FIG. 4 shows that a soft error will be latched only if it occurs within the time interval marked as $T_L$. (It is assumed that soft errors do not occur during a pre-charge phase because pull-up pMOSFET 208 is sufficiently strong to maintain node 204 HIGH.) From the timing diagram in FIG. 4, it is seen that $T_L = DT_C - T_D + T_H$.

Let $P_S$ denote the probability of a soft error occurring during an evaluation phase, and let $P_L$ denote the probability that a soft error occurring during an evaluation phase is latched. Then, $$P_L = P_S T_L / (DT_C).$$

Figure 5:
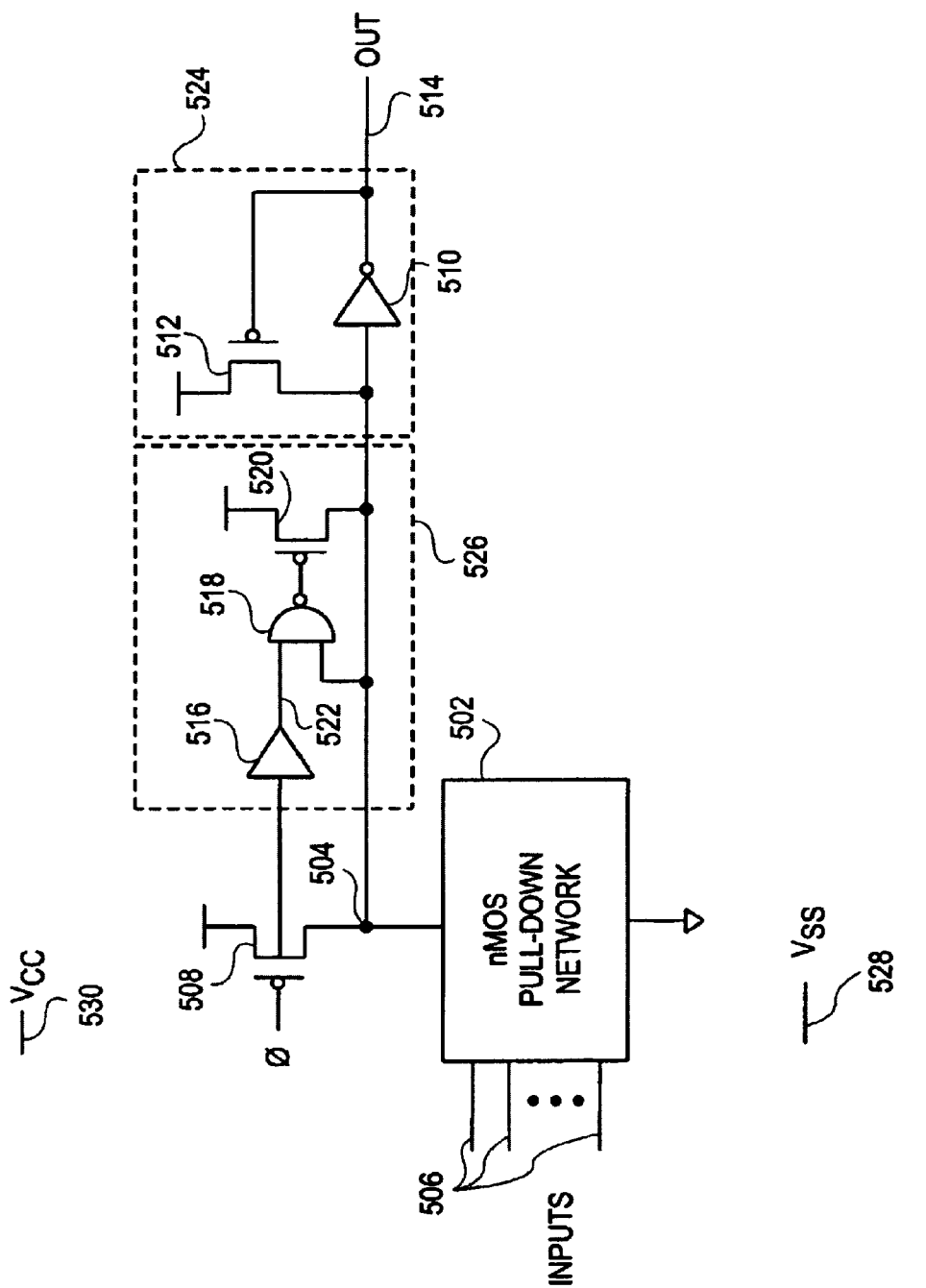
FIG. 5 is an embodiment of the present invention.

An embodiment of the present invention at the circuit level is provided in FIG. 5. The clock signal is again represented by φ, where during a pre-charge phase, the clock signal and input ports 506 are LOW (e.g., $V_{SS}$) so that pull-up pMOSFET 508 charges node 504 HIGH (e.g., $V_{CC}$). By charging node 504 HIGH, it is meant that a low impedance path is provided between node 504 and power rail 530, whose potential is denoted as $V_{CC}$. During an evaluation phase, the clock signal is HIGH and nMOS pull-down network 502 provides a conditional low impedance path between node 504 and ground rail (substrate) 528, depending upon the logical states of input ports 506. If a conditional low impedance path is provided by nMOS pull-down network 502, node 504 is discharged to $V_{SS}$. Upon completing an evaluation, the output signal at output port 514 propagates through other logic circuits (not shown) and is eventually captured by a latch or other dynamic stage. (For a boundary stage, an additional clocked pull-down nMOSFET may be inserted between ground rail 528 and nMOS pull-down network 502 to isolate nMOS pull-down network 502 from ground rail 528 during a pre-charge phase.)

Half-keeper 524, comprising inverter 510 and pull-up pMOSFET 512, is sized to ideally maintain node 504 HIGH at the beginning of an evaluation phase unless node 504 is otherwise pulled LOW by nMOS pull-down network 502. Delay element 516, NAND gate 518, and pull-up pMOSFET 520, may be viewed as forming conditional half-keeper 526. In some embodiments, pull-up pMOSFET 520 is sized much stronger than pMOSFET 512. The clock signal is provided to the input port of delay element 516. Delay element 516 may be two inverters serially connected, for example.

During a pre-charge phase, the clock signal is LOW, and consequently pull-up pMOSFET 520 is OFF during the pre-charge phase, except perhaps for a small nonzero time interval starting at the beginning of the pre-charge phase. (This small time interval may arise if node 504 was evaluated HIGH in the preceding evaluation phase, for then the parasitic capacitance at input port 522 may maintain input port 522 HIGH until the LOW clock signal propagates through delay element 516 and discharges input port 522 LOW. In practice, the delay introduced by delay element 516 is much less than the pre-charge time interval, and consequently the time interval for which pull-up pMOSFET 520 may be ON during the pre-charge phase will be much smaller than the total pre-charge phase time interval.)

The delay for delay element 516 is chosen large enough such that when the clock signal transitions from LOW to HIGH (the dynamic gate enters its evaluation phase), node 504 will have time to evaluate before the transition in the clock signal has time to propagate through delay element 516 to input port 522. (Of course, the delay is also chosen to be less than the evaluation time interval.) Consequently, when the clock signal transitions from LOW to HIGH, pull-up pMOSFET 520 is initially OFF while node 504 evaluates. If node 504 evaluates LOW, then pull-up pMOSFET 520 will stay OFF throughout the evaluation phase, and nMOS pull-down network 502 need only contend with pull-up pMOSFET 512 to discharge node 504 to $V_{SS}$. However, if node 504 evaluates HIGH, then pull-up pMOSFET 520 will turn ON at some time interval $T_E$ after the beginning of the evaluation phase. Because nMOS pull-down network 502 need not contend with pMOSFET pull-up 520, the evaluation time and gate speed for the dynamic gate of FIG. 5 is expected to be about the same for the case in which conditional half-keeper 526 was not present.

Ideally, the delay provided by delay element 516 is such that pull-up pMOSFET 520 switches ON just after node 504 evaluates HIGH. Let $T_E$ denote the time interval from when the evaluation phase begins to when pull-up pMOSFET 520 switches ON if node 504 evaluates HIGH. At the beginning of an evaluation phase, either node 504 is pulled LOW to $V_{SS}$ by nMOS pull-down network 502, in which case the dynamic gate is not sensitive to soft errors, or node 504 is held HIGH at $V_{CC}$ by pull-up pMOSFET 512, and the dynamic gate is sensitive to soft errors. For the latter case in which node 504 evaluates HIGH, pull-up pMOSFET 520 will turn ON at time $T_E$ (relative to the beginning of the evaluation phase), in which case both pull-ups 520 and 512 are ON. In a preferred embodiment pull-up 520 is sized stronger than pull-up 512. For both pull-ups 520 and 512 ON, it is expected that the probability of a soft error will be substantially smaller than if only pull-up 512 was ON.

Figure 6:
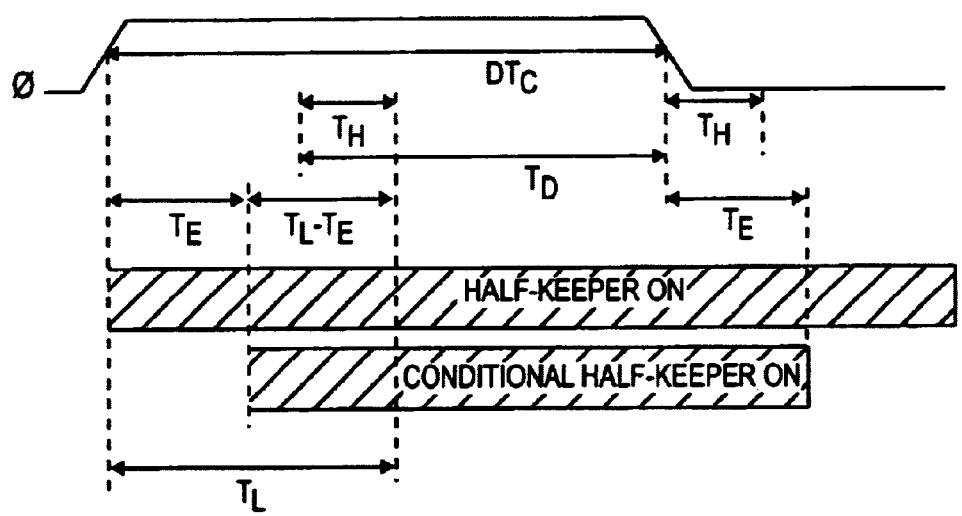
FIG. 6 is a timing diagram for the embodiment of FIG. 5 as used in a pipelined circuit.

Consequently, in light of the above discussion, because soft errors are more likely when node 504 is evaluated HIGH than when evaluated LOW, it is expected that the embodiment of FIG. 5 may be designed to realize a significantly smaller soft error rate (probability) than the embodiment of FIG. 2. To make this statement somewhat more precise, consider the timing diagram in FIG. 6. A soft error will be latched only if it occurs within the time interval $T_L$, as discussed earlier with respect to FIG. 4. As seen from FIG. 6, there are two disjoint events to consider: The event of a soft error occurring within the time interval $T_E$ for which only pull-up pMOSFET 512 is ON; and the event of a soft error occurring within the time interval $T_L - T_E$ for which both pull-ups 512 and 520 are ON. Again, let $P_S$ denote the probability of a soft error occurring during an evaluation phase when only pull-up 512 is ON. Let $P_{S2}$ denote the probability of a soft error occurring during an evaluation phase when both pull-ups 512 and 520 are ON. Let $P_{L2}$ denote the probability that a soft error occurring during an evaluation phase is latched. Then, $$P_{L2} = P_S T_E / (DT_C) + P_{S2}(T_L - T_E)/(DT_C).$$

Because pull-up pMOSFETs 520 and 512 acting together are stronger than pull-up 512, and in a preferred embodiment pMOSFET 520 is sized stronger than pMOSFET 512, $P_{S2} \ll P_S$, and the above displayed equation for $P_{L2}$ may be simplified to $$P_{L2} = P_S T_E / (DT_C).$$

The ratio of probabilities for a soft error being latched for the embodiment of FIG. 5 compared to that of FIG. 2 is then given by $$P_{L2}/P_L = T_E/T_L.$$

From the above equation, it is seen that the embodiment of FIG. 5 may have a significantly less latched soft error rate than the embodiment of FIG. 2 provided $T_E \ll T_L$, all other factors being the same.

Various modifications may be made to the disclosed embodiments without departing from the scope of the invention claimed below. It is to be understood in the claims below that a set of objects may be a set of only one object.

What is claimed is:

1. A dynamic gate comprising:
   a node;

a pull-down network to conditionally discharge the node LOW during an evaluation phase; and a pull-up to charge the node HIGH by switching ON during the evaluation phase, wherein the pull-up switches ON only if the pull-down network does not conditionally discharge the node LOW during the evaluation phase.

2. The dynamic gate as set forth in claim 1, further comprising a half-keeper connected to the node, wherein the pull-up is substantially stronger than the half-keeper.

3. The dynamic gate as set forth in claim 2, wherein the pull-up is substantially stronger than the half-keeper.

4. The dynamic gate as set forth in claim 1, wherein the pull-up comprises a delay element, a static gate, and a pMOSFET.

5. A dynamic gate comprising:

an input port to receive a clock signal;

a ground rail;

a power rail;

a node;

a pull-down network to provide a conditional low impedance path between the node and the ground rail only if the clock signal is HIGH;

a delay element to provide a signal indicative of a delayed clock signal, the delayed clock signal lagging in phase with respect to the clock signal; and a pull-up to provide a low impedance path between the node and the power rail only if the node and delayed clock signal are HIGH.

6. The dynamic gate as set forth in claim 5, further comprising:

a static logic gate having a first input port connected to the node and a second input port connected to the delay element to provide an output logic signal;

wherein the output logic signal is LOW only if the node and delayed clock signal are HIGH, and wherein the pull-up further comprises a pMOSFET coupled to the static logic gate to have a gate voltage equal to the output logic signal.

7. The dynamic gate as set forth in claim 6 further comprising a half-keeper, wherein the pMOSFET is substantially stronger than the half-keeper.

8. The dynamic gate as set forth in claim 5 further comprising a half-keeper, wherein the pull-up is substantially stronger than the half-keeper.

9. A dynamic gate comprising:

an input port to receive a clock signal;

a node having a node signal;

a pull-down network connected to the node to conditionally discharge the node HIGH only if the clock signal is HIGH;

a pull-up pMOSFET having a drain connected to the node and having a gate; and a static logic gate having a first input port to receive the clock signal, a second input port connected to the node, an output port connected to the gate of the pull-up pMOSFET; the static logic gate to provide a logic signal indicative of a delayed version of the clock signal, and to provide at its output port a NAND function of the logic signal and the node signal.

10. The dynamic gate as set forth in claim 9, the static logic gate further comprising a delay element.

11. The dynamic gate as set forth in claim 10, further comprising a half-keeper substantially weaker than the pull-up pMOSFET.

12. A computer system comprising:

a bus;

a memory unit coupled to the bus; and a microprocessor comprising:

a node;

a pull-down network to conditionally discharge the node LOW during an evaluation phase; and a pull-up to charge the node HIGH by switching ON during the evaluation phase, wherein the pull-up switches ON only if the pull-down network does not conditionally discharge the node LOW during the evaluation phase.

13. The computer system as set forth in claim 12, the microprocessor further comprising a half-keeper connected to the node, wherein the pull-up is substantially stronger than the half-keeper.

* * * * *